United States Patent [19]
Fehrenbach et al.

[11] 3,943,308
[45] Mar. 9, 1976

[54] CONTROL FOR NAVIGATION RECEIVERS, RADIO COMPASSES, RADIO, AND AIRCRAFT TELEPHONY, TRANSPONDERS AND THE LIKE

[75] Inventors: Karl Heinz Fehrenbach, Buhl; Ludwig Holl, Sandweier; Eberhard L. Grunewald, Rastatt, all of Germany

[73] Assignee: Becker Flugfunwerk GmbH, Baden-Baden, Germany

[22] Filed: May 2, 1974

[21] Appl. No.: 466,445

[30] Foreign Application Priority Data
Aug. 18, 1973 Germany.............................. 7330174

[52] U.S. Cl.................... 200/18; 200/5 R; 200/14; 200/153 P
[51] Int. Cl.²........................................... H01H 3/54
[58] Field of Search....... 200/1 R, 11 R, 11 DA, 14, 200/17 R, 18, 153 P, 5 R, 5 A, 291, 153 PA

[56] References Cited
UNITED STATES PATENTS

| | | |
|---|---|---|
| 2,787,713 | 4/1957 | Aust et al................ 200/11 DA UX |
| 2,813,935 | 11/1957 | Bang..................... 200/1 R |
| 2,886,661 | 5/1959 | Skelton et al....................... 200/5 R |
| 2,938,987 | 5/1960 | Brown............................. 200/5 A X |
| 2,980,901 | 4/1961 | Morris et al................. 200/153 P X |
| 2,982,824 | 5/1961 | Forrest...................... 200/11 DA X |
| 3,187,118 | 6/1965 | Butler et al......................... 200/5 R |
| 3,242,762 | 3/1966 | Durand et al.................. 200/291 X |
| 3,287,511 | 11/1966 | Schwab.................................. 200/14 |
| 3,754,106 | 8/1973 | MacDonald.................... 200/11 DA |
| 3,793,496 | 2/1974 | Kimura et al.................. 200/5 R X |

*Primary Examiner*—James R. Scott
*Attorney, Agent, or Firm*—Allison C. Collard

[57] ABSTRACT

A control for navigation receivers, radio compasses, radio, and aircraft telephony, transponders, and the like, comprising at least one control plate means arranged in series and spaced apart from each other behind a front plate, and sprocket wheel means having associated stop wheels for controlling frequencies and other suitable operational functions, respectively, connected with each other by coupling members and rotary knobs. Yieldable control contacts are mounted on the sprocket wheels which cooperate with rest controls mounted on a printed circuit and are operatively connected with the control plate means.

3 Claims, 3 Drawing Figures

CONTROL FOR NAVIGATION RECEIVERS, RADIO COMPASSES, RADIO, AND AIRCRAFT TELEPHONY, TRANSPONDERS AND THE LIKE

The present invention relates to a control for navigation receivers, radio compasses, radio-, and aircraft telephony, transponders and the like.

Such controls generally consist of one or a plurality of control plates or control plate bars which are arranged in series and at a distance spaced apart from each other behind a front plate. Between these control plates, there are provided sprocket wheels with associated stop wheels for controlling frequency or other suitable operational functions, which are connected with each other by coupling means and rotatable knobs.

In the known embodiments, the sprocket wheels and the stop wheels are coupled with, so called, single or multiple plate rotary switches, whereby a rotatable sliding contact is mounted within a surrounding rest contact unit.

Such an arrangement, however, requires a lot of space at the rear of the control elements, and accordingly, such an arrangement is rather disadvantageous, since the space available in planes and vehicles is rather small.

It is therefore an object of the present invention to reduce the size of the aforementioned controls which extend into the rear of the device, so that these controls can be more easily installed in the available space. Furthermore, the control in accordance with the present invention is also provided with a more simplified control arrangement, and it is another object of the present invention to provide this simplified arrangement.

The object of the present invention is achieved by providing a control for navigation receivers, radio compasses, radio-, and aircraft telephony devices, and the like, comprising substantially one or a plurality of control plates or control plate bars which are mounted in series and are spaced from each other. Between these control plates sprocket wheels are provided with associated stop or ratchet wheels for controlling frequency or other suitable functional operations and are connected with each other by coupling means, such as rotary knobs, and yieldable control contacts are mounted on the sprocket wheels which cooperate with rest controls mounted on a printed circuit, which are suitably connected with the control plates and/or control plate bars.

In accordance with a particular embodiment of the present invention, one or a plurality of sliding insulated contacts may be connected with each other on the face of the sprocket wheel, as desired. However, the yieldable sliding contacts may be mounted on additional coupling bushings which are connected with the sprocket wheels by a shaft, so that they cooperate with the rest contacts of intermediary contact plates and/or control plate bars. The yieldable contacts may be mounted on insulated bushings which are mounted in the face of the sprocket wheels or coupling bushings.

Due to the novel control, the commonly used rotary knobs are eliminated, because the yieldable contacts which are connected with the sprocket wheels cooperate directly with the rest contacts which are mounted on the printed circuit. This arrangement also simplifies the manufacturing of the control, because the rest contacts may be directly connected with the remainder of the conductor paths and control elements of the printed circuit which are mounted between the individual sprocket wheels.

Finally, the space extending rearwardly of the front plate is substantially reduced, so that devices may be constructed with the novel control which do not require much space in the rear of the device, so that the devices can be easily installed in air planes and vehicles.

Other objects and features of the present invention will become apparent from reference to the drawings, which disclose a preferred embodiment of the novel control, in accordance with the present invention, of which FIG. 1 is a front view of a control for navigation receiver in accordance with the present invention;

Figure 1:
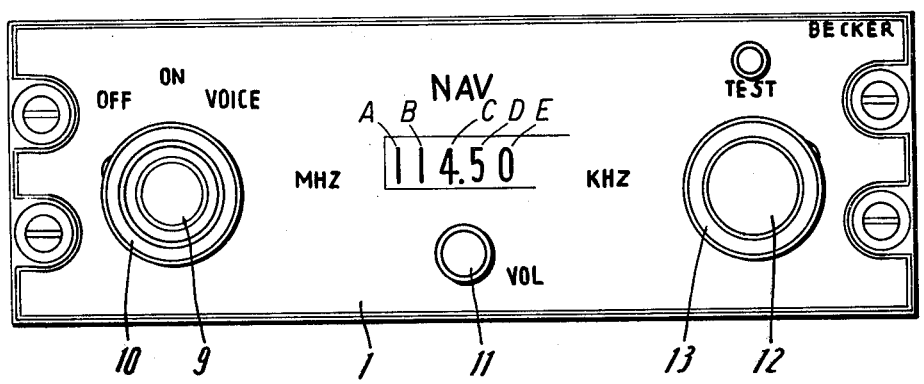
Figure 3:
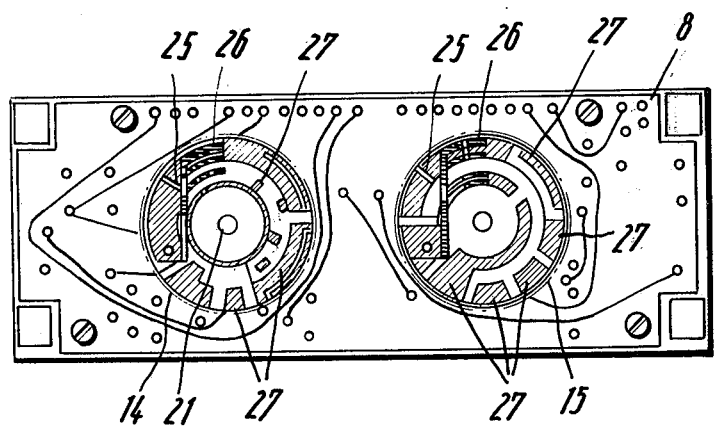
FIG. 3 is a sectional view along lines A-B of FIG. 2 with a plan view of the yieldable contacts and the rest controls.

With reference to the drawings, the novel control in accordance with the present invention substantially comprises a front plate 1 having a printed panel. A control plate 6 is mounted opposite to the front plate by means of distance bolts 2, 3 and 4, 5. There is provided between the front plate 1 and control plate 6, a plate bar 7 with a printed circuit on plate 6, as well as a further printed contact plate 8. Suitable operational functions may be switched with control knob 9, while control knob 11 adjusts the sound level. With knobs 10, 12 and 13 the frequencies of the receiving channels can be adjusted, and simultaneously the frequency indication is carried out by rotary discs which are provided with printed digits. Digits A, B and C are actuated with knob 10, digit D with knob 13 and digit E with knob 12.

The individual control knobs are connected with couplings 31 mounted on first shaft means 31a to sprocket wheels 14, 15, 16 and 17 which are mounted on corresponding axles. The sprocket wheels are provided with rest or ratchet wheels 18, 19 and 20 which are connected with the axles. The rest or ratchet wheels permit the sprocket wheels to always engage in a desired position, for example, a position which corresponds to the frequency adjustment.

Figure 2:
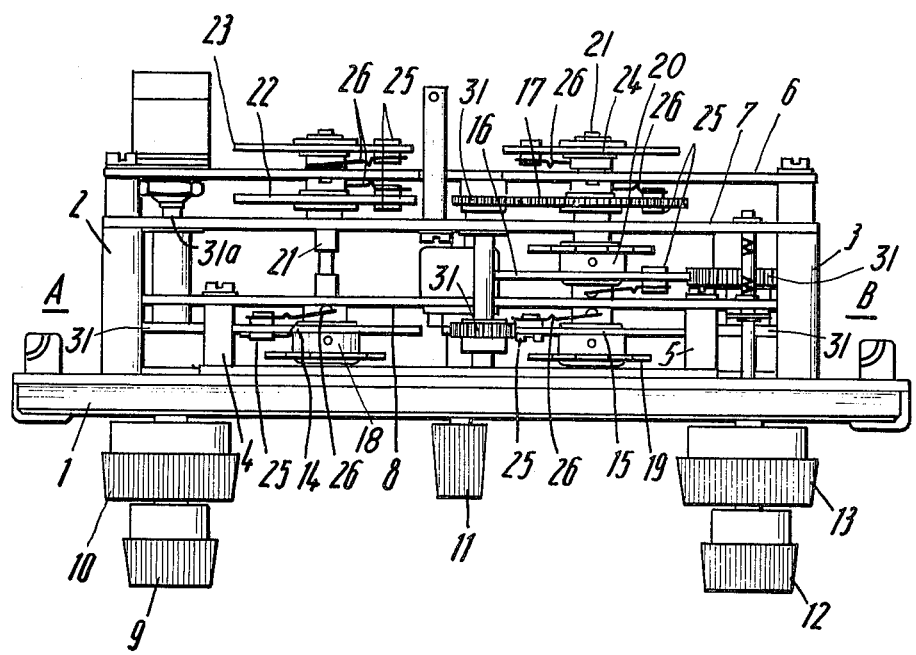
FIG. 2 is a plan view of the control according to FIG. 1.

Sprocket wheel 14 is connected by shaft 21 (constituting a second shaft means parallel to the first shaft means 31a) with two contact discs 22 and 23 which are mounted between control plate 6. Sprocket wheel 17 is connected with a contact disc which is also mounted behind control plate 6. Insulating bushings 25 are mounted in sprocket wheels 14, 15, 16 and 17 and in contact discs 22, 23 and 24. Yieldable contacts 26 are inserted in these bushings, whereby the front contact faces of the contacts slidably engage the rest contacts 27 of contact plates 6 and 8, and corresponding to the position of the individual sprocket wheels and contact discs in dependency of the individual positions of the rest or ratchet wheels 18, 19 and 20, accomplish the desired connection, for example, adjustment of the frequency or any other suitable operational function. The sprocket wheels 14, 15, 16 and 17 are of gear shape similar to that of sprocket sheel 17 as shown in FIG. 2.

It is to be understood that a plurality of sliding contacts may be provided on one sprocket wheel or one coupling bushing or contact disc which are then connected with each other as desired.

The illustrated embodiment is not limited to a control for navigation receivers but may also be used, in an analog changing manner, for a radio compass, a transponder, a radio-, and aircraft telephony and the like, whereby in accordance with the different control conditions, different control plates and/or control plate bars may be used. The number of control plates and plate bars and the number of the sprocket wheels with contacts can be arbitrarily used.

While only a single embodiment of the present invention has been shown and described, it will be obvious to those of ordinary skill in the art that many changes and modifications may be made thereunto without departing from the spirit and scope of the invention.

What is claimed is:

1. The control for navigation receivers, radio compasses, radio, and aircraft telephony, transponders, and the like comprising:
  a front plate;
  a plurality of control plates each having a printed circuit thereon and spaced apart and freely mounted to said front plate;
  rest contacts mounted on said printed circuit;
  rotary knobs mounted and disposed on a first shaft means in said front plate;
  coupling means operatively connected to said rotary knobs;
  sprocket wheels having associated ratchet wheels operatively connected with each other by said coupling means;
  a plurality yieldable control contact means operatively mounted on said sprocket wheels and a second shaft means parallel to said first shaft means which cooperate with said rest contacts for operatively controlling frequencies and other operational functions;
  said yieldable control contact means comprise contact discs coupled with said sprocket wheels by means of said second shaft means; and
  insulating bushings mounted on said contact discs, and said sprocket wheels; wherein at least one of said control contact means is operatively disposed on said insulating bushings on said sprocket wheels and said contact discs, respectively, and said control contact means each have a yieldable front contact face which cooperates with said rest contacts such that a desired control connection is achieved.

2. The control as set forth in claim 1 wherein:
said contact faces constitute sliding contacts cooperating with the corresponding rest contacts.

3. The control as set forth in claim 2 wherein:
said coupling means via said rotary knobs controls said sprocket wheels with said yieldable control contact means.

* * * * *